United States Patent
Miyamoto et al.

(10) Patent No.: US 9,812,473 B2
(45) Date of Patent: Nov. 7, 2017

(54) IMAGE SENSOR AND IMAGE CAPTURING APPARATUS

(71) Applicant: CANON KABUSHIKI KAISHA, Tokyo (JP)

(72) Inventors: Yoshiaki Miyamoto, Tama (JP); Satoshi Suzuki, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/079,741

(22) Filed: Mar. 24, 2016

(65) Prior Publication Data

US 2016/0293646 A1    Oct. 6, 2016

(30) Foreign Application Priority Data

Apr. 3, 2015  (JP) .................. 2015-077142

(51) Int. Cl.
| H01L 31/0232 | (2014.01) |
| H01L 27/146 | (2006.01) |
| H04N 5/357 | (2011.01) |
| H04N 5/361 | (2011.01) |

(52) U.S. Cl.
CPC .. *H01L 27/14607* (2013.01); *H01L 27/14601* (2013.01); *H01L 27/14625* (2013.01); *H04N 5/3572* (2013.01); *H04N 5/361* (2013.01)

(58) Field of Classification Search
CPC ......... H01L 27/14601; H01L 27/14607; H01L 27/14625

USPC ........... 257/436, 443, 432, 227; 438/65; 1/1; 348/311, 308, 44; 359/265

See application file for complete search history.

(56) References Cited

U.S. PATENT DOCUMENTS

| 5,592,286 A * | 1/1997 | Fedor | G01N 21/9054 |
| | | | 250/223 B |
| 2006/0007369 A1* | 1/2006 | Jin | G02F 1/13336 |
| | | | 349/58 |
| 2012/0099173 A1* | 4/2012 | Gentry | B60R 1/08 |
| | | | 359/265 |
| 2012/0217606 A1* | 8/2012 | Itonaga | H01L 31/0203 |
| | | | 257/443 |
| 2016/0050379 A1* | 2/2016 | Jiang | H04N 5/2253 |
| | | | 348/311 |
| 2016/0172393 A1* | 6/2016 | Kim | H01L 27/14603 |
| | | | 348/308 |
| 2016/0266388 A1* | 9/2016 | Dobschal | G02C 7/086 |
| 2016/0286102 A1* | 9/2016 | Sulfridge | H01L 21/00 |

FOREIGN PATENT DOCUMENTS

JP    2001-156278 A    6/2001

* cited by examiner

*Primary Examiner* — Mohammed Shamsuzzaman
(74) *Attorney, Agent, or Firm* — Fitzpatrick, Cella, Harper & Scinto

(57) ABSTRACT

An image sensor to which is provided an image sensing plane that receives light from a subject whose image has been formed by a lens, the image sensing plane having a flat shape portion and a curved shape portion.

11 Claims, 4 Drawing Sheets

FIG. 6A
FIG. 6B
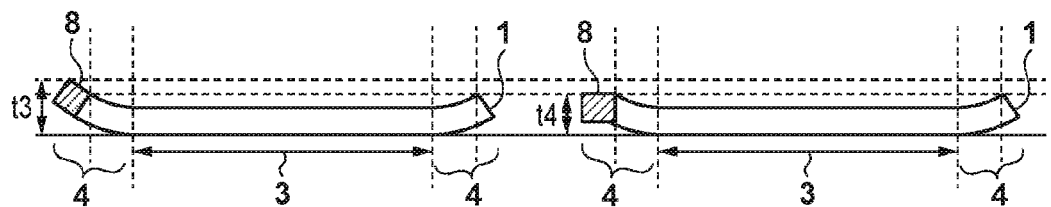
FIG. 7
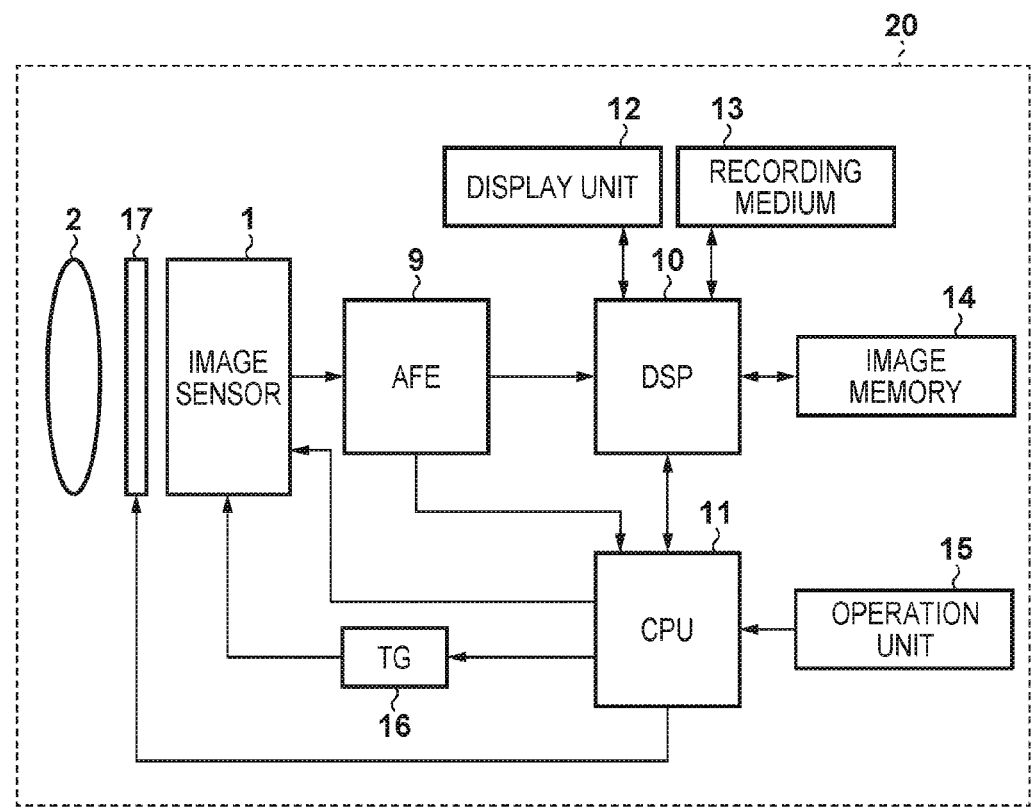

IMAGE SENSOR AND IMAGE CAPTURING APPARATUS

BACKGROUND OF THE INVENTION

Field of the Invention

The present invention relates to an image sensor and an image capturing apparatus that uses the image sensor.

Description of the Related Art

Image sensors such as CCD image sensors and CMOS image sensors are mounted in image capturing apparatuses such as digital still cameras and digital video cameras. These image sensors have a large number of pixels that include photoelectric conversion units such as photodiodes that perform photoelectric conversion.

Generally, an imaging optical system is needed in order to form an image of a subject on an image sensing plane of the image sensor. A lens is used for the imaging optical system, and a subject image is formed on the image sensor by this lens. Here, a difference occurs in the light amount that is incident on pixels in a central portion and a peripheral portion of the image sensing plane, due to a difference in the angle of incidence of light between the central portion and the peripheral portion of the image sensing plane. This causes degradation in image quality such as decreased light at the periphery, and is particularly marked in the case where the distance between the lens and the image sensor (exit pupil distance) is short. Also, this difference in the light amount increases according to the distance from the central portion, and the decrease in light appears markedly particularly in the peripheral portion of the image.

FIG. 1 is a diagram showing an example of the amount of decrease in light at the periphery for a given lens position with a conventional flat image sensor. The horizontal axis shows the distance from the center position of the image sensor (diagonal position). Also, the vertical axis shows the degree to which light decreases, taking the brightness at the center of the image sensor as 100%. As seen in FIG. 1, the degree to which light decreases becomes greater as the distance from the center position increases.

With regard to this problem, Japanese Patent Laid-Open No. 2001-156278 proposes a method of curving the image sensor into a cylindrical shape or a spherical shape. With this technology, the distance from the center of the lens to each pixel can be kept constant, thus enabling degradation of image quality due to the decrease in light at the periphery to be reduced.

However, with the method disclosed in Japanese Patent Laid-Open No. 2001-156278, the entire image sensing plane of the image sensor is formed into a curved shape, and the overall thickness of the image sensor including the package increases. When the thickness of the image sensor increases, there is a problem in that the outer dimensions of an image capturing apparatus such as a camera or the like equipped with the image sensor also increase.

Furthermore, in an image capturing apparatus provided with a focal-plane shutter, the distance between the shutter and the image sensor lengthens at the central portion of the image sensor due to the image sensor having a curved shape. Thus, there is also a problem in that shutter efficiency drops, and precise exposure control of the image sensor can no longer be performed.

SUMMARY OF THE INVENTION

The present invention has been made in view of the above-mentioned problems, and suppresses a decrease in light at the periphery without increasing the overall thickness of an image sensor.

According to a first aspect of the present invention, there is provided an image sensor comprising: an image sensing plane that receives light from a subject whose image has been formed by a lens, wherein the image sensing plane has a flat shape portion and a curved shape portion.

According to a second aspect of the present invention, there is provided an image capturing apparatus comprising: an image sensor provided with an image sensing plane that receives light from a subject whose image has been formed by a lens, the image sensing plane having a flat shape portion and a curved shape portion; and the lens.

Further features of the present invention will become apparent from the following description of exemplary embodiments with reference to the attached drawings.

BRIEF DESCRIPTION OF THE DRAWINGS

FIGS. 6A and 6B are diagrams showing the shape of the image sensor according to the second embodiment.

FIG. 7 is a block diagram showing an example of an image capturing apparatus having the image sensor of the first or second embodiment.

DESCRIPTION OF THE EMBODIMENTS

Hereinafter, embodiments of the present invention will be described in detail with reference to the accompanying drawings.

First Embodiment

Figure 3A:
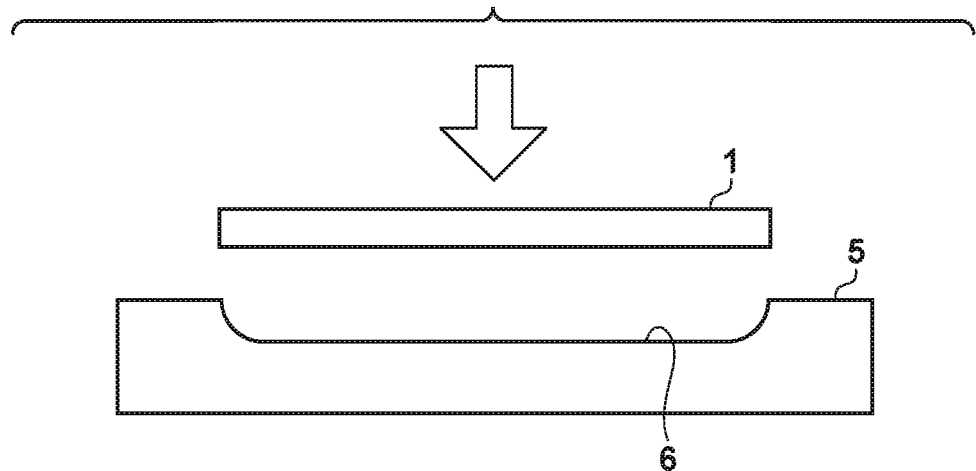
FIGS. 3A and 3B are diagrams illustrating a manufacturing method of the image sensor in the first embodiment.
Figure 3B:
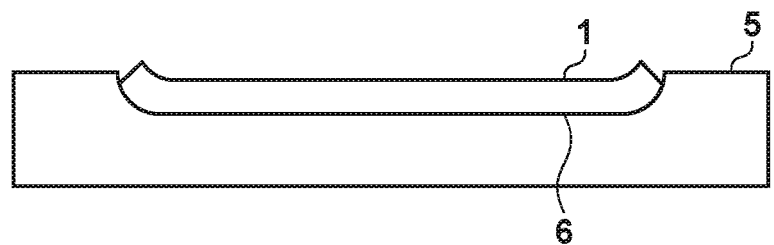

FIGS. 3A and 3B are diagrams showing a manufacturing method of an image sensor in a first embodiment. The image sensor of the present embodiment has an area that is flat (referred to below as a flat area) and an area that is curved (referred to below as a curved area) on the image sensing plane. As shown in FIG. 3A, the outer dimensions of a holding member 5 are greater than the image sensor 1, and a recessed portion 6 that includes a flat area and a curved area is formed in the upper surface of the holding member 5.

Stress is applied downward from the image sensing plane side of the image sensor 1 in a state where the image sensing plane is facing upward, so as to bring the image sensor 1 in contact with the recessed portion 6 of the holding member 5. This enables the shape of the image sensor 1 to be set to conform to the shape of the recessed portion 6, as shown in FIG. 3B. Also, the flat area and the curved area can be highly accurately formed in the image sensing plane of the image sensor 1, and the image sensing plane can be made to hold that shape.

Figure 2A:
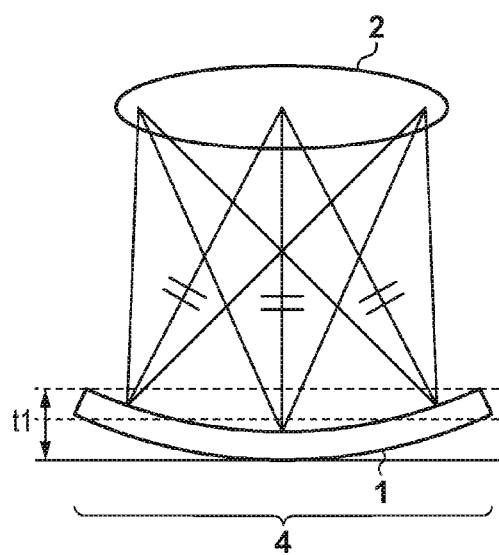
FIGS. 2A and 2B are diagrams showing the shape of an image sensor in a first embodiment.
Figure 2B:
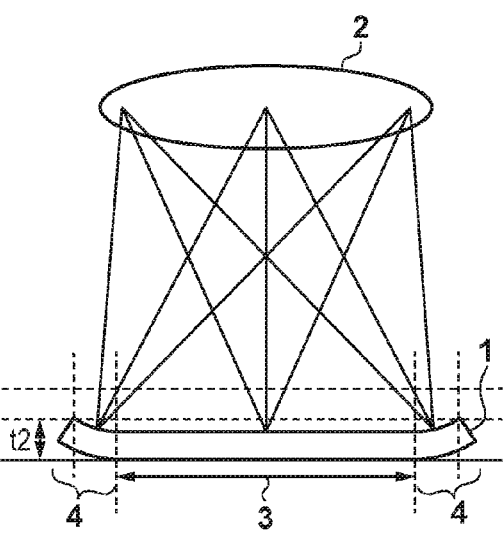

FIGS. 2A and 2B are diagrams showing the positional relationship of the image sensor 1 and a lens 2. FIG. 2A is a cross-sectional view shown for comparison with the configuration of the present embodiment, and shows the case where the entire image sensor 1 is curved, such that the distance from the center of the lens 2 to the light receiving plane of the image sensor 1 (length of the principal ray) will be the same. The image sensor 1 has a thickness t1 in the curved state.

Figure 1:
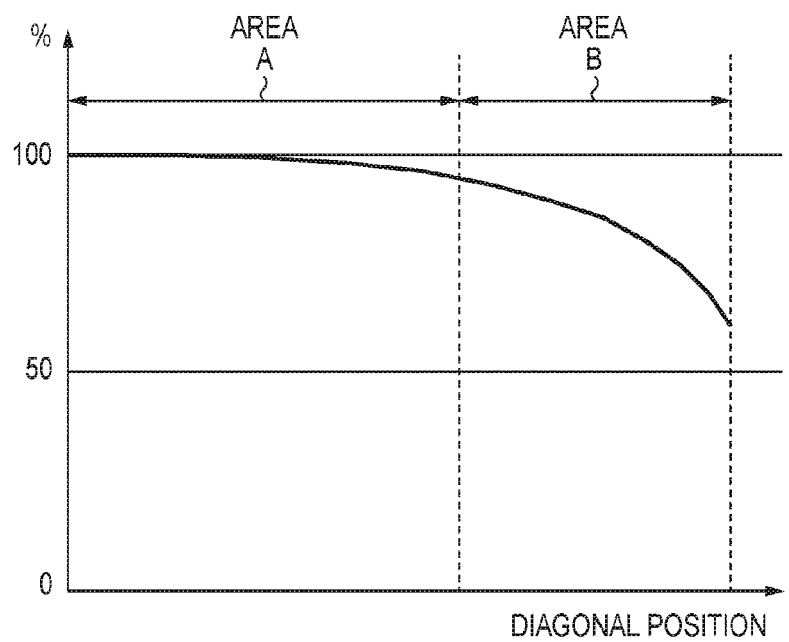
FIG. 1 is a diagram showing an example of data relating to a decrease in light at the periphery of a lens.

Here, as seen in FIG. 1 mentioned above, even with a conventional flat image sensor, the degree to which light decreases in an area A (central portion) that spans a given distance from the center position is small compared with an area B (peripheral portion), and the decrease in light is also not noticeable in the image. In the configuration of FIG. 2A, the image sensor 1 is overly thick due to the area of the central portion, where the improvement effect on the decrease in light at the periphery is small, being curved.

In contrast, FIG. 2B is a cross-sectional view showing the positional relationship of the image sensor 1 and the lens 2 in the present embodiment. In the present embodiment, only the peripheral portion of the image sensor 1 where the decrease in light at the periphery needs to be suppressed is formed into a curved shape. That is, the central portion of the image sensor 1 where the decrease in light is not noticeable is formed into a flat shape, and the peripheral portion where the decrease in light is noticeable is formed into a curved shape. The portion having the flat shape will be referred to as a flat shape portion 3 and the portion having the curved shape will be referred to as a curved shape portion 4. Note that the curvature of the curved shape portion 4 is desirably set such that the distance from the center of the lens 2 to the surface of the curved shape portion 4 (length of the principal ray) will be the same. In the configuration of the present embodiment shown in FIG. 2B, the image sensor 1 has a thickness t2 in the curved state.

When the thickness t1 of the image sensor in which the entire image sensor is curved as shown in FIG. 2A is compared with the thickness t2 of the image sensor in which the central portion is formed to be flat as shown in FIG. 2B, the relationship t1>t2 is established. That is, forming the central portion to be flat, as in the present embodiment, enables the thickness of the image sensor to be reduced.

By forming only the peripheral portion of the image sensor 1 where the decrease in light at the periphery needs to be suppressed to have a curved shape, the overall thickness of the image sensor including the package can be reduced while suppressing the decrease in light at the periphery.

Also, one type of aberration that occurs in a lens is field curvature aberration, which results in the peripheral portion being out of focus when the central portion is in focus. By forming the image sensor of the present embodiment to have a curved peripheral portion, the peripheral portion will also be in focus if the central portion is in focus, and thus the influence of field curvature aberration can be suppressed.

Figure 4A:
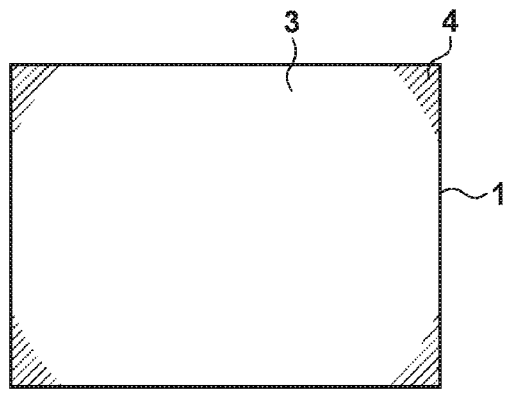
FIGS. 4A to 4C are diagrams showing exemplary shapes of the image sensor in the first embodiment.
Figure 4B:
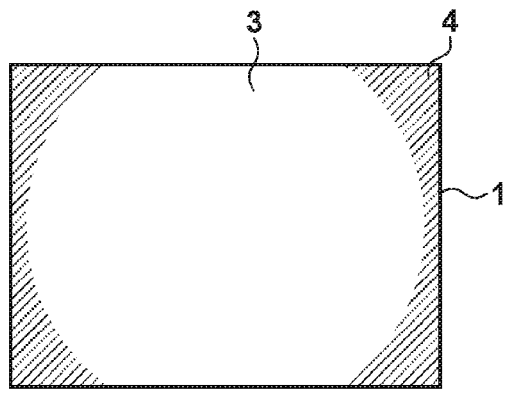
Figure 4C:
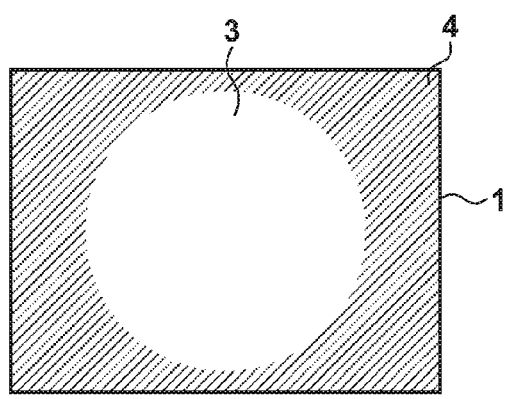

FIGS. 4A to 4C are diagrams showing image sensing planes of the image sensor provided with the curved shape portion 4 in which areas where the degree to which light decreases at the periphery is high are hatched. Here, the image sensor 1 has a pixel area in which unit pixels provided with photoelectric conversion units that generate signal charges according to the received light amount are arranged in a matrix. The boundary between the flat area 3 and the curved area 4 is set to the same distance relative to the center of the pixel area which serves as a reference point.

FIGS. 4A, 4B and 4C are diagrams showing modifications in which the ratios of the flat area 3 and the curved area 4 are different, with the distance from the center of the pixel area to the boundary being set such that 4A>4B>4C. For example, in the case where three lenses whose relationship of pupil distances is A>B>C are used, the image sensor of FIG. 4A is used in an image capturing apparatus that uses the lens having the pupil distance A. Similarly, the image sensor of FIG. 4B is used in an image capturing apparatus that uses the lens having the pupil distance B, and the image sensor of FIG. 4C is used in an image capturing apparatus that uses the lens having the pupil distance C.

This enables the decrease in light at the periphery to be appropriately suppressed. Note that the present invention is not limited to the examples shown in FIGS. 4A to 4C, and various modifications and changes can be made without departing from the spirit of the invention. For example, in an image capturing apparatus in which the image capturing lens is interchangeable, a configuration may be adopted in which the area ratio of the flat area and the curved area is dynamically changed according to the degree to which light decreases at the periphery of the image capturing lens that is mounted. As described above, in the first embodiment, the thickness of the image sensor can be reduced while suppressing the decrease in light at the periphery, by forming the curved area only in required areas of the pixel area.

Second Embodiment

Figure 5:
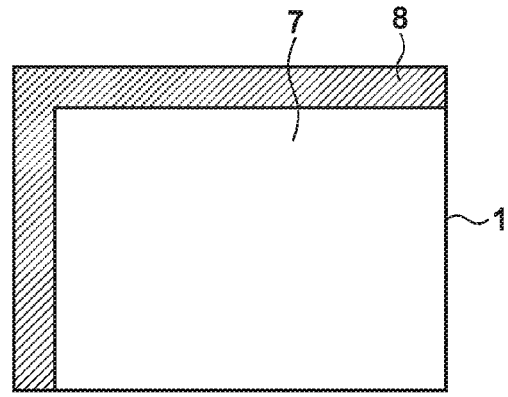
FIG. 5 is a diagram showing the arrangement of pixels in an image sensor according to a second embodiment.

Hereinafter, an image sensor according to a second embodiment of the present invention will be described. FIG. 5 is a diagram showing the image sensing plane of the image sensor according to the second embodiment. The pixel area of the image sensor 1 in the present embodiment is provided with an effective pixel area 7 and a black reference pixel area 8 shown with a hatched pattern adjacent to the effective pixel area 7. The effective pixel area 7 is a pixel area having photoelectric conversion units that generate signal charges according to the received light amount. The black reference pixel area 8 is a shaded pixel area in which photoelectric conversion units are shaded with a wiring layer or the like. A black reference signal for determining a reference value (black level) for the output value of the effective pixel area 7 is output from this black reference pixel area 8. The black reference pixel area 8 is arranged on the upper side and the left side of the image sensor 1 shown in FIG. 5. The black reference pixel area is partially or entirely constituted by a curved shape portion.

In the present embodiment, the curvature of the effective pixel area 7 and the curvature of the black reference pixel area 8 in the curved shape portion 4 shown in FIGS. 4A to 4C are different.

FIGS. 6A and 6B are side views of the image sensor 1. FIG. 6A is a cross-sectional view of the image sensor 1 shown for comparison with the configuration of the present embodiment, and shows the case where the curvature of the black reference pixel area 8 and the curvature of the effective pixel area 7 in the curved shape portion 4 are set to be the same. In the configuration of FIG. 6A, the thickness of the image sensor 1 is t3. FIG. 6B is a cross-sectional view of the image sensor 1 in the present embodiment, and shows the case where curvature of the black reference pixel area 8 in the curved shape portion 4 is configured to be less than the curvature of the effective pixel area 7. In the configuration of FIG. 6B, the thickness of the image sensor 1 is t4. The curvature of the black reference pixel area 8 is configured to be less than the curvature of the effective pixel area 7 because the amount of incident light on the pixels does not need to be taken into account since the black reference pixel area 8 is shaded. When the thickness t3 of the image sensor 1 of FIG. 6A is compared with the thickness t4 of the image sensor 1 of the present embodiment shown in FIG. 6B, the relationship t3>t4 is established. Note that the boundary between the flat area 3 and the curved area 4 is set to the same distance relative to the center of the effective pixel area 7, in order to suppress the decrease in light at the periphery effectively.

FIG. 7 is a block diagram showing an example of an image capturing apparatus that has the image sensor of the first or second embodiment. The image capturing apparatus 20 is provided with the image sensor 1, the lens 2, an analog front end (AFE) 9 that includes an A/D conversion circuit, and a digital signal processor (DSP) 10. The image capturing apparatus 20 is configured to be further provided with a CPU 11, a display unit 12, a recording medium 13, an image memory 14, an operation unit 15, a timing generator (TG) 16, and a focal-plane shutter 17. Note that the AFE 9 may be configured to be built into the image sensor 1.

The lens 2 forms a subject image on the image sensor 1. Note that the relative positions of the lens 2 and the image sensor 1 are set such that the point (point on the optical axis) at which the optical axis of the lens 2 and the image sensing plane of the image sensor 1 intersect will be located at the center of the effective pixel area 7; that is, such that the boundary between the flat area 3 and the curved area 4 of the image sensor 1 will be located at the same distance relative to the point (point on the optical axis) at which the optical axis of the lens 2 and the image sensing plane of the image sensor 1 intersect. The time of incidence (i.e., exposure time) of the light on the image sensor 1 is controlled by the focal-plane shutter 17.

The image sensor 1 converts the subject image formed by the lens 2 into a captured image signal through photoelectric conversion and outputs the captured image signal. The captured image signal output from the image sensor 1 is input to the AFE 9. The AFE 9 amplifies the captured image signal input from the image sensor 1, and generates a digital signal by performing A/D conversion processing. The DSP 10 performs various types of image processing and compression processing on the digital signal output from the AFE 9, and generates image data.

The image data generated by the DSP 10 is written to the image memory 14. The image data written to the image memory 14 is recorded to the recording medium 13 under the control of the DSP 10. The display unit 12 displays various types of settings that are configured by the user and image data recorded in the image memory 14. A liquid crystal display (LCD), for example, is used as the display element of the display unit 12. The TG 16 supplies a control signal generated in order to perform a predetermined image sensing drive to the image sensor 1. The operation unit 15 inputs operation instructions of a readout mode, various functions and the like that are provided in the image capturing apparatus, based on operations by the user. The CPU 11 controls the image sensor 1, the AFE 9, the DSP 10, the TG 16, the focal-plane shutter 17 and the like, based on various types of information that are input by the operation unit 15.

As described above, in the second embodiment, the thickness of the image sensor can be reduced while suppressing the decrease in light at the periphery, by forming the curved area only in required areas. Furthermore, the overall thickness of the image sensor can be reduced, by changing the curvature of the black reference pixel area 8 and the effective pixel area 7, or more specifically, by configuring the curvature of the black reference pixel area 8 to be less than the curvature of the effective pixel area 7.

According to the first and second embodiments, an improvement in the image quality of images captured with an image capturing apparatus and a reduction in the outer dimensions of the image capturing apparatus can both be achieved. Also, by reducing the thickness of the image sensor, a drop in the shutter efficiency of an image capturing apparatus that captures images with a focal-plane shutter can be suppressed.

Although preferred embodiments of the present invention have been described above, the present invention is not limited to these embodiments, and various modifications and changes can be made without departing from the spirit of the invention. For example, in the first embodiment, it was assumed that it is desirable to set the curvature of the curved shape portion 4 such that the distance from the center of the lens 2 to the surface of the curved shape portion 4 (length of the principal ray) will be the same. However, even if the curvature of the curved shape portion 4 is set such that the distance from the center of the lens to the light receiving plane of the image sensor 1 (length of the principal ray) will be the same, a difference may occur in the light amount that is incident on the curved shape portion, depending on the characteristic of the lens. Thus, a configuration may be adopted in which the curvature is changed according to the lens. Also, although the second embodiment was described using an example in which the black reference pixel area is a shaded pixel area in which the photoelectric conversion units are shaded with a wiring layer or the like, a pixel area that is not provided with photoelectric conversion units may be formed as the black reference pixel area. In this case, the black reference pixel area need not be shaded.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-077142, filed Apr. 3, 2015, which is hereby incorporated by reference herein in its entirety.

What is claimed is:

1. An image sensor comprising:
an image sensing plane that receives light from a subject whose image has been formed by a lens,
wherein the image sensing plane has a central flat planar portion and a peripheral curved shape portion,
wherein the central flat planar portion is arranged in a region of the image sensing plane which is less influenced by field curvature aberration of the lens and the peripheral curved shape portion is arranged in a region of the image sensing plane which is more influenced by field curvature aberration of the lens, and
wherein the central flat planar portion enables a thickness of the image sensor to be reduced, and the curved shape suppresses decrease in light at the peripheral curved shape portion.

2. The image sensor according to claim 1, wherein a position of a boundary between the central flat planar portion and the peripheral curved shape portion is set to a same distance relative to a center of the image sensing plane.

3. The image sensor according to claim 2, wherein the image sensing plane has a pixel area in which unit pixels are arranged in a matrix.

4. The image sensor according to claim 3,
wherein the pixel area has an effective pixel area from which a signal that depends on a received light amount is output and a black reference pixel area from which a black reference signal is output, and
the effective pixel area is constituted by the central flat planar portion and the peripheral curved shape portion.

5. The image sensor according to claim 4, wherein the reference point is located in a center of the effective pixel area.

6. The image sensor according to claim 4,
wherein the black reference pixel area is arranged adjacent to the effective pixel area,
the black reference pixel area is partially or entirely constituted by a curved shape portion, and
a curvature of the curved shape portion of the black reference pixel area differs from a curvature of the curved shape portion of the effective pixel area.

7. The image sensor according to claim 6, wherein the curvature of the curved shape portion of the black reference pixel area is less than the curvature of the curved shape portion of the effective pixel area.

8. The image sensor according to claim 4, wherein the black reference pixel area is constituted by shaded unit pixels that include photoelectric conversion units.

9. The image sensor according to claim 4, wherein the black reference pixel area is constituted by unit pixels that do not include photoelectric conversion units.

10. An image capturing apparatus comprising:
an image sensor provided with an image sensing plane that receives light from a subject whose image has been formed by a lens, the image sensing plane having a central flat planar portion and a peripheral curved shape portion, the central flat planar portion being arranged in a region of the image sensing plane which is less influenced by field curvature aberration of the lens and the peripheral curved shape portion being arranged in a region of the image sensing plane which is more influenced by field curvature aberration of the lens; and
the lens,
wherein the central flat planar portion enables a thickness of the image sensor to be reduced, and the curved shape suppresses decrease in light at the peripheral curved shape portion.

11. The image capturing apparatus according to claim 10, wherein a reference point is located on an optical axis of the lens.

* * * * *